(12) United States Patent
Lee

(10) Patent No.: US 11,487,634 B2
(45) Date of Patent: Nov. 1, 2022

(54) APPARATUS AND METHOD FOR HANDLING ERROR IN VOLATILE MEMORY OF MEMORY SYSTEM BASED ON A TYPE OF DATA AND A STATE OF DATA

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 430 days.

(21) Appl. No.: 16/582,592

(22) Filed: Sep. 25, 2019

(65) Prior Publication Data

US 2020/0226039 A1 Jul. 16, 2020

(30) Foreign Application Priority Data

Jan. 11, 2019 (KR) .................. 10-2019-0003823

(51) Int. Cl.
| | |
|---|---|
| *G06F 11/08* | (2006.01) |
| *G06F 11/16* | (2006.01) |
| *G06F 11/10* | (2006.01) |
| *G11C 29/42* | (2006.01) |

(Continued)

(52) U.S. Cl.
CPC ........ *G06F 11/167* (2013.01); *G06F 11/0793* (2013.01); *G06F 11/102* (2013.01); *G11C 11/4094* (2013.01); *G11C 29/42* (2013.01)

(58) Field of Classification Search
CPC .............. G06F 11/1012; G06F 11/102; G06F 11/1024; G06F 11/1028; G06F 11/1068; G11C 2029/1202; G11C 2029/1204; G11C 2029/1208; G11C 29/12; G11C 29/38; G11C 11/4091; G11C 11/4094; G11C 11/4096; G11C 11/4097

See application file for complete search history.

(56) References Cited

U.S. PATENT DOCUMENTS

| | | | | | |
|---|---|---|---|---|---|
| 5,107,501 A | * | 4/1992 | Zorian | .................. | G11C 29/10 |
| | | | | | 714/720 |
| 5,357,471 A | * | 10/1994 | Alapat | .................. | G11C 29/02 |
| | | | | | 365/189.15 |

(Continued)

FOREIGN PATENT DOCUMENTS

| | | |
|---|---|---|
| KR | 10-1529880 | 6/2015 |
| KR | 10-1606498 | 4/2016 |
| KR | 10-2017-0003743 | 1/2017 |

OTHER PUBLICATIONS

Wikipedia's Static random-access memory historical version published Dec. 3, 2018 https://en.wikipedia.org/w/index.php?title=Static_random-access_memory&oldid=871822539 (Year: 2018).*

*Primary Examiner* — Joseph O Schell
(74) *Attorney, Agent, or Firm* — IP & T Group LLP

(57) ABSTRACT

An apparatus for controlling an operation in a memory system includes a volatile memory including plural memory cells, a column data checking circuitry configured to determine whether all pieces of data outputted from memory cells corresponding to a bit line are identical to each other, and an error correction circuitry configured to determine whether the pieces of data include an error based at least on a type of data, a state of data, and an output of the column data checking circuitry, and to resolve the error.

17 Claims, 11 Drawing Sheets

| TYPE OF DATA | | STATE OF DATA | | COLUMN DATA DECISION | |
|---|---|---|---|---|---|
| METADATA | USER DATA | Dirty | Clean | NONSUBJECT REGION | SUBJECT REGION |
| ERROR CHECK | Don't Care | ERROR AUTO CORRECTION | Re-loading | ERROR RECOGNITION | Don't Care |

(51) Int. Cl.
*G11C 11/4094* (2006.01)
*G06F 11/07* (2006.01)

(56) References Cited

U.S. PATENT DOCUMENTS

| | | | | |
|---|---|---|---|---|
| 5,490,105 | A | * | 2/1996 | Chandna ............... G11C 11/412 365/156 |
| 7,277,307 | B1 | * | 10/2007 | Yelluru .................. G11C 15/04 365/189.07 |
| 2005/0278595 | A1 | * | 12/2005 | Anzou ............... G11C 29/1201 714/733 |
| 2008/0040652 | A1 | * | 2/2008 | Ausserlechner .... G06F 11/1008 714/804 |
| 2009/0319843 | A1 | * | 12/2009 | Meir ................... G06F 11/1068 714/E11.023 |
| 2014/0053041 | A1 | * | 2/2014 | Sakaue ............... H03M 13/293 714/758 |
| 2014/0129872 | A1 | * | 5/2014 | Bueb ................ H03M 13/3746 714/2 |
| 2016/0179620 | A1 | | 6/2016 | Bazarsky et al. |
| 2017/0060657 | A1 | * | 3/2017 | Healy ................. G06F 11/1048 |

* cited by examiner

FIG. 9

| TYPE OF DATA | | STATE OF DATA | | COLUMN DATA DECISION | |
|---|---|---|---|---|---|
| METADATA | USER DATA | Dirty | Clean | NONSUBJECT REGION | SUBJECT REGION |
| ERROR CHECK | Don't Care | ERROR AUTO CORRECTION | Re-loading | ERROR RECOGNITION | Don't Care |

APPARATUS AND METHOD FOR HANDLING ERROR IN VOLATILE MEMORY OF MEMORY SYSTEM BASED ON A TYPE OF DATA AND A STATE OF DATA

CROSS-REFERENCE TO RELATED APPLICATION

This patent application claims priority under 35 U.S.C. § 119(a) to Korean Patent Application No. 10-2019-0003823, filed on Jan. 11, 2019, the entire disclosure of which is incorporated herein by reference.

TECHNICAL FIELD

Various embodiments of the invention relate to a memory system, and more particularly, to a method and apparatus for handling or curing an error in a volatile memory that supports an operation of a controller and/or a nonvolatile memory device included in a memory system.

BACKGROUND

Recently, the paradigm for a computing environment has shifted to ubiquitous computing, which enables computer systems to be accessed anytime and everywhere. As a result, the use of portable electronic devices, such as mobile phones, digital cameras, notebook computers and the like, are rapidly increasing. Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device using a nonvolatile semiconductor memory device is advantageous in that it has excellent stability and durability because it has no mechanical driving part (e.g., a mechanical arm), and has high data access speed and low power consumption. In the context of a memory system having such advantages, an exemplary data storage device includes a universal serial bus (USB) memory device, a memory card having various interfaces, a solid state drive (SSD) or the like.

BRIEF DESCRIPTION OF THE DRAWINGS

The description herein makes reference to the accompanying drawings wherein like reference numerals refer to like parts throughout the figures, and wherein:

FIG. 9 illustrates an operation of an error correction circuitry in accordance with an embodiment of the disclosure.

DETAILED DESCRIPTION

Figure 1:
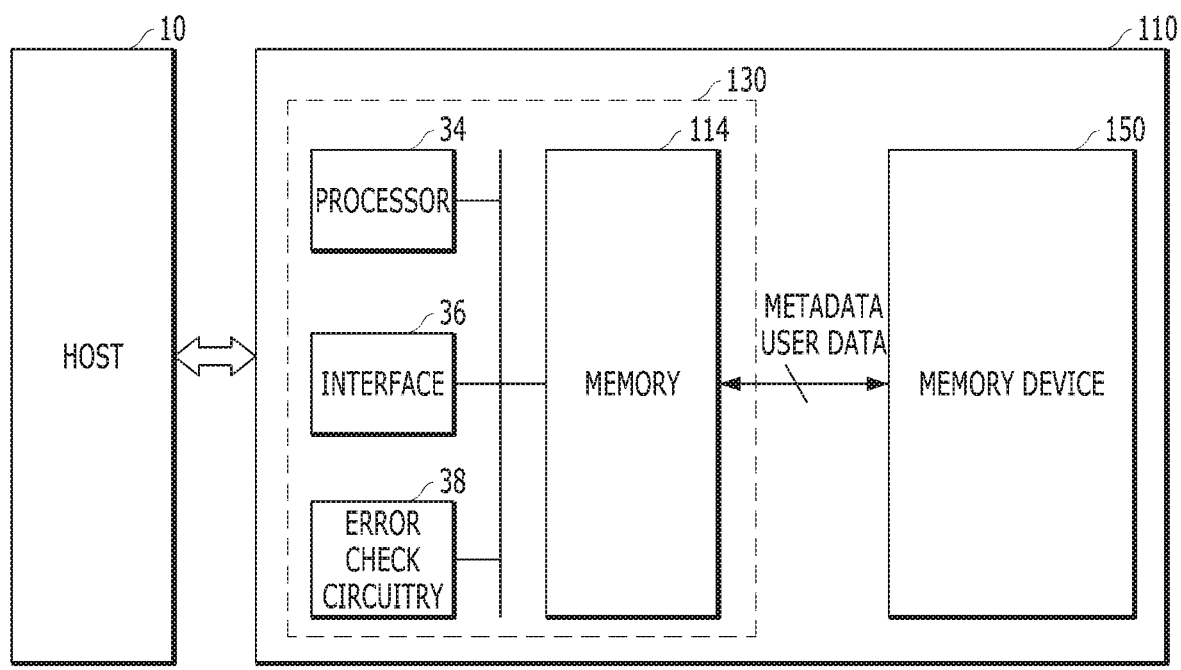
FIG. 1 illustrates a memory system in accordance with an embodiment of the disclosure.

Various embodiments of the disclosure are described below in more detail with reference to the accompanying drawings. Elements and features of the disclosure, however, may be configured or arranged differently to form other embodiments, which may be variations of any of the disclosed embodiments. Thus, the present invention is not limited to the embodiments set forth herein. Rather, the described embodiments are provided so that this disclosure is thorough and complete and fully conveys the scope of the disclosure to those skilled in the art to which this invention pertains. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise. The articles 'a' and 'an' as used in this application and the appended claims should generally be construed to mean 'one or more' unless specified otherwise or it is clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the disclosure and the relevant art, and should not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure may provide a memory system, a data processing system, and an operation process or a method, which may quickly and reliably process data into a memory device by reducing operational complexity and performance degradation of the memory system, thereby enhancing usage efficiency of the memory device.

Embodiments of the disclosure may provide a method and an apparatus that may identify errors in a volatile memory operating at high speed to support an operation of a controller in a nonvolatile memory system, and handle, recover or cure identified errors so as to enhance or increase operational reliability of the nonvolatile memory system.

Embodiments of the disclosure may include a method and an apparatus that may have a simplified structure of logic and circuitry to identify an error in a volatile memory of a highly integrated circuit to maintain a degree of integration of the highly integrated circuit while avoiding lowering an operating speed of the highly integrated circuit.

Embodiments of the disclosure may provide a method and apparatus for increasing an yield of a highly integrated circuit such as a processor by replacing a memory cell in a cache memory included in the highly integrated circuit with a redundant memory cell when it is presumed that an error of the memory cell in the cache memory is caused by a permanent damage, not a temporary damage.

In an embodiment, an apparatus for controlling an operation in a memory system may include a volatile memory including plural memory cells; a column data checking circuitry configured to determine whether all pieces of data outputted from memory cells corresponding to a bit line are identical to each other; and an error correction circuitry configured to determine whether all pieces of data include an error based at least on a type of data, a state of data and an output of the column data checking circuitry, and to resolve the error.

The volatile memory may include a static random access memory (SRAM) including at least one memory cell including plural transistors.

The column data checking circuitry may include a comparator coupled to a buffer or an amplifier which is coupled with the memory cells via the bit line, and configured to compare two pieces of data outputted sequentially.

The column data checking circuitry may further include a latch for temporarily storing a piece of data delivered through the bit line; and a switch for selectively connecting the latch and the comparator.

The volatile memory may include a subject region including memory cells coupled via some bit lines and a non-subject region including other memory cells coupled via other bit lines, based on the type of data. For example, the error correction circuitry may be configured to divide the volatile memory into the subject region and the non-subject region.

The error correction circuitry may be configured to determine that there is an error in at least one of memory cells corresponding to a column address when all pieces of data outputted from the memory cells corresponding to the column address in the non-subject region are not identical to each other.

The error correction circuitry may be configured to: change an erroneous value of data into another value which is the same as other pieces of data when it is determined that the error exists in the non-subject region; and determine how to recover the error, based on the state of data, when it is determined that the error exists in the subject region.

The error correction circuitry may be configured to: determine that each data is in either a first state which is the same as a value when each data is loaded in the volatile memory or a second state which is updated after each data is loaded in the volatile memory; and determine how to recover the error based on the state of data.

The error correction circuitry may be configured to: reload data including an error from a nonvolatile memory device to resolve the error, when the state of data is the first state; and perform an error correction recovery on the data including an error when the state of data is the second state.

The apparatus may further include an error location checking circuitry configured to track a location of a memory cell corresponding to the error when the error correction circuitry determines that the error is included in all pieces of data.

The error location checking circuitry may be configured to adjust a range of data outputted to the column data checking circuitry to track the location of the memory cell corresponding to the error.

The apparatus may further include a memory adjusting circuitry configured to store the location of the memory cell corresponding to the error, which is tracked by the error location checking circuitry, monitor whether another error has occurred repeatedly at the same location to determine whether the corresponding memory cell is considered a bad memory cell, and replace the corresponding memory cell with a redundancy cell.

In another embodiment, a memory system may include a nonvolatile memory device including plural memory blocks; and a controller including a volatile memory configured to store at least one of metadata or user data during an operation for writing the user data in the nonvolatile memory device or reading the user data stored in the nonvolatile memory device. Herein, the controller may be configured to determine whether all pieces of data include an error based at least on a type of data and a state of data, and to resolve the error.

The volatile memory may include plural memory cells which are individually addressable through a row address corresponding to a word line and a column address corresponding to a bit line.

The controller may include a column data checking circuitry configured to determine whether all pieces of data outputted from memory cells corresponding to a single bit line are identical to each other; and an error correction circuitry configured to determine whether all pieces of data include an error based at least on the type of data, the state of data and an output of the column data checking circuitry, and to recover the error.

In another embodiment, a method for operating a memory system may include setting a target area for error check in a volatile memory including a plurality of memory cells addressable through a row address corresponding to a word line and a column address corresponding to a bit line; determining whether plural pieces of data outputted from memory cells corresponding to each column address in the target area are the same as each other; and determining whether an error is included in the plural pieces of data based on a type of data, a state of data and a column data comparison result between the plural pieces of data stored in the target area to cure the error.

The target area of the volatile memory may include a subject region including memory cells coupled via some bit lines and a non-subject region including other memory cells coupled via other bit lines, based on the type of data. By the way of example but not limitation, the method may further include dividing the target area of the volatile memory into the subject region including memory cells coupled via some bit lines and the non-subject region including other memory cells coupled via other bit lines, based on the type of data.

The method may further include determining that there is no error in at least one of memory cells corresponding to the column address when all pieces of data outputted from the memory cells corresponding to the column address in the non-subject region are identical to each other.

The determining of whether an error is included may include determining that each data is in either a first state which is the same as a value when each data is loaded in the volatile memory or a second state which is updated after each data is loaded in the volatile memory; and determining how to recover the error based on the state of data.

The determining of whether an error is included may further include reloading data including an error from a nonvolatile memory device to resolve the error, when the state of data is the first state; and performing an error correction recovery on the data including an error when the state of data is the second state.

In another embodiment, a controller may include a volatile memory including a plurality of memory cells coupled between multiple word lines and multiple bit lines, the plurality of memory cells including a first region for storage of data and a second region; and a circuit suitable for: reading pieces of data from select memory cells coupled to a select bit line among the multiple bit lines; performing an XOR operation for the pieces of data to generate an operation result; and detecting whether the pieces of data include an error, based on the operation result and determining whether the select memory cells belong to the first region or the second region.

Embodiments of the disclosure will now be described in detail with reference to the accompanying drawings, wherein like numbers reference like elements.

FIG. 1 illustrates an apparatus for searching for valid data and performing garbage collection in a memory system 110 in accordance with an embodiment of the disclosure. The memory system 110 may include a controller 130 and a memory device 150. The memory system 110 may be operatively engaged with a host 10 or another device, e.g., a computing device.

Referring to FIG. 1, the memory system 110 may include a controller 130 and a memory device 150. The controller 130 receives and outputs data requested from the host 10, from the memory device 150 or stores the data received from the host 10 into the memory device 150 in order to perform command operations requested from the host 10. The memory device 150 includes a plurality of memory blocks including plural memory cells each capable of storing 1-bit or multi-bit data. For example, the internal configuration of the memory device 150 may be changed in accordance with the characteristics of the memory device 150, the purposes for which the memory system 110 is used, the specifications of the memory system 110 required by the host 10, or the like.

The controller 130 may include at least one processor 34, a memory 114, and at least one interface 36. The processor 34 may play a role for command operations within the controller 30, similar to that of a CPU used in a computing device. The at least one interface 36 may include a host interface and a memory interface. The host interface is for data communication between the memory system 110 and the host 10, while the memory interface is for data communication between the memory device 150 and the controller 130. The memory 114 may temporarily store data and operation status required during operations performed by the processor 34 and the interface 36. Alternatively, the memory 114 may temporarily store I/O data (e.g., read data or write/program data) between the memory device 110 and the host 10. The internal configuration of the controller 130 may be a function classification according to an operation or a task, which is handled or processed by the controller.

The memory 114 may be a kind of volatile memory. For example, the memory 114 may include a static RAM (SRAM) or a dynamic RAM (DRAM). The memory 114 may temporarily store a piece of data, or a piece of operational information, which are generated, updated or transferred by operations performed by the processor 34 and the interface 36.

In order to stably support an operation performed by or in the controller 130, the memory 114 may have no defective memory cell. Alternatively, even though some memory cells are defective, these may be replaced with other cells which are not defective in a redundant area or a substitute region. During the operation of the memory system 110, a temporary or permanent failure or error may occur in a specific memory cell of the memory 114 because of wear-out and electromagnetic fields. By way example but not limitation, there is a bit-flip error occurring in a memory cell of the memory 114 such as an SRAM during an operation of the memory system 110. In the case of an SRAM memory cell that includes plural transistors operating at a high speed, the operation of at least one transistor in the SRAM memory cell may be undesirable due to an electromagnetic field, so that a piece of data stored in the SRAM memory cell is changed from a logic low '0' to a logic high '1' or vice versa. This error may be referred as to a bit-flip error.

An error checking circuitry 38 of the controller 130 may search for an error that may occur in the memory 114 and determine how to recover the error when the error is detected. According to an embodiment, the error checking circuitry 38 may determine whether an error is included in pieces of data, according to characteristics, types or states of the pieces of data stored in the memory 114. Further, in response to a state of the pieces of data stored in the memory 114, the error checking circuitry 38 may determine how to handle, cure or recover the error occurred in the memory 144. In an embodiment, a recovery method that may be selected by the error checking circuitry 38 may include re-loading the pieces of data from the memory device 150, directly correcting the pieces of data, and discarding the pieces of data.

As used in the disclosure, the term 'circuitry' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

According to an embodiment, the physical configuration of the controller 130 may be composed of at least one processor, at least one memory, at least one input/output port, and a wiring for electrical connection between the above-mentioned components.

The controller 130 and the memory device 150 may exchange metadata and user data with each other. For example, the user data includes data to be stored by a user through the host 10, and the metadata includes system information (e.g., map data) necessary for storing and managing the user data in the memory device 150. The user data and the meta data may be processed or managed in different ways in the controller 130 because the properties of the user data and meta data are different from each other.

As a storage capacity of the memory device 150 increases, the size of status information also increases. Such status information may include system information, map information, and/or operation information necessary for operations such as reading, programming, and erasing data within the dies, blocks, or pages in the memory device 150. It is difficult for the controller 130 to store all the status information in the memory 114. Thus, the system information, the map information, and the operation information for operation such as reading, programming, and erasing may be stored in the memory device 150, as well as user data. The controller 130 may load, from the plurality of dies or blocks in the memory device 150, some information necessary for operations such as reading, programming, or erasing data from pages in the memory device 150, and then re-store the updated information in the memory device 150 after the corresponding operation is completed.

Although not shown, as the number of memory cells capable of storing data in the memory device 150 increases, the memory device 150 may include plural memory dies coupled with the controller 130 via plural channels and plural ways. The controller 130 may transmit or receive connection information according to the internal configuration of the memory device 150 together with the data. For example, in a case when a plurality of dies, each including multiple blocks, is included in the memory device 150, there are n channels and m ways (where n or m is an integer greater than 1) between the controller 130 and the memory device 150. The data and the connection information may be transferred via the n channels and the m ways. However, in order for the controller 130 to read or write data to the memory device 150, additional control variables or control signals may be needed depending on the internal structure of the memory device 150. As more dies are included in the memory device 150, additional information required for performing operations becomes larger.

For example, the host 10 and the memory system 1100 may exchange commands, addresses, and data with each other, according to a protocol, a system communication method, or an interface. Thus, the host 10 may not need to be aware of the specific structure within the memory system 110. When the host 10 stores specific data to the memory system 110 or attempts to read data stored in the memory system 110, the host 10 sends a logical block address (LBA). For example, the logical block address (LBA) is a logical block addressing method, and may be a format used to specify the location of a data block to be stored in a storage device associated with a computing device. For example, in the case of a conventional hard disk, an addressing method indicating a physical structure included in a hard disk, such as a cylinder, a head, and a sector (e.g., cylinder-head-sector (CHS)) was used. However, the address system corresponding to the physical structure of the hard disk has reached the limit as the storage capacity of the hard disk increases. In such a large-capacity storage device, the address may be specified in a manner that the sectors are arranged in a logical sequence in a row, and the sectors are numbered (for example, in order from 0), regardless of the physical structure of the hard disk. Instead of the host 10 transferring or pointing data only to the logical block address (LBA), the controller 130 in the memory system 110 may store and manage the physical address, which is the address in the memory device 150 where the actual data is stored. It is necessary to match and manage the logical block address (LBA) used by the host 10. Such information may be included in metadata and may be distinguished from user data stored or read by the host 10.

As the amount of data that may be stored in the memory device 40 increases, efficient management of metadata may be required. Also, as the size of the plurality of blocks in the memory device 150 increases, the amount of data that may be stored increases as well as the amount of metadata which also increases. This increases the resources (e.g., time) required to maintain and manage the stored data in the memory device 150, so that an apparatus and method for increasing the operational efficiency, stability, or reliability of the memory system 110 may be required.

According to an embodiment, the memory system 110 may include a memory device 150 that includes a plurality of blocks capable of storing data. In addition, the memory system 110 may include the controller 130 configured to divide each block into a plurality of logical unit blocks. The controller 130 may compare a valid page count of the block with the number of map data of each logical unit block, check whether the map data is duplicated in a reverse order of programming data in the block, and delete or nullify old duplicated map data. A procedure for comparing, verifying and deleting by the controller 130 to adjust the map data may be performed in a specific block having a state in which data can no longer be written to that block without an erase operation (for example, a closed state).

The controller 130 may compare the valid page count with the number of map data when plural program operations with different data corresponding to a same logical block address is repeatedly required by commands entered from the host 10. According to an embodiment, each of plural memory blocks in the memory device 150 may be stored sequentially from the first page to the last page therein. Herein, a block is a unit in which an erase operation is performed. At least two logical unit blocks may be included in a block. The logical unit block may be a minimum unit to which map data is allocated or managed together. Here, the map data may include information (e.g., physical to logical (P2L)) used for associating a physical address, assigned in each block unit, with a logical address used by the host 10.

Figure 2:
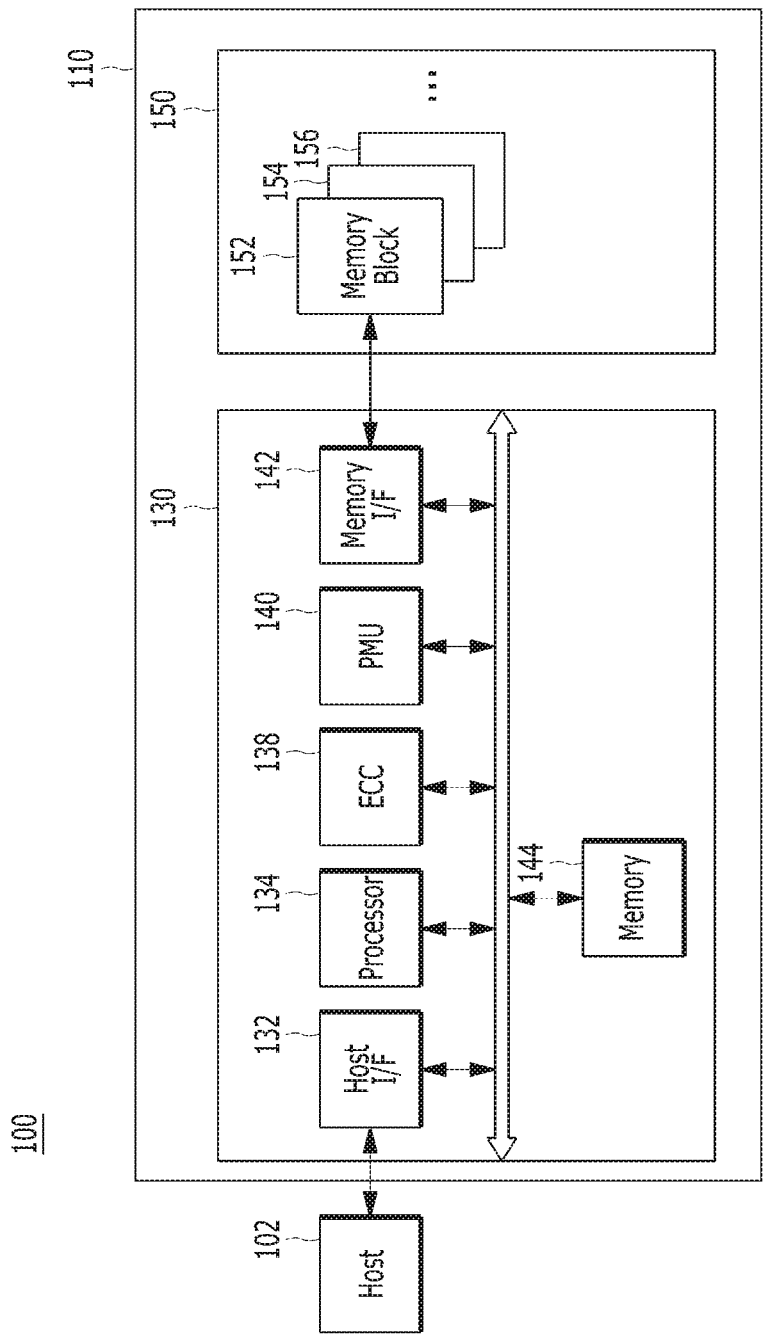
FIG. 2 shows a data processing system including a memory system in accordance with an embodiment of the disclosure.

FIG. 2 illustrates a data processing system 100 in accordance with an embodiment of the disclosure. Referring to FIG. 2, the data processing system 100 may include a host 102 engaged or interlocked with a memory system 110.

The host 102 may include, for example, a portable electronic device such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS may provide interoperability between the host 102 engaged with the memory system 110 and the user needing and using the memory system 110. The OS may support functions and operations corresponding to a user's requests. By way of example but not limitation, the OS may be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described later, in reference to FIGS. 4 and 5.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated into an SSD for improving an operation speed. When the memory system 110 is used as an SSD, the operating speed of the host 102 connected to the memory system 110 may be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (e.g., SM, SMC), a memory stick, a multimedia card (e.g., MMC, RS-MMC, MMCmicro), a secure digital (SD) card (e.g., SD, miniSD, microSD, SDHC), a universal flash memory or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes a plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102. The controller 130 may store the data, provided by the host 102, into the memory device 150.

The controller 130 may include a host interface (I/F) 132, a processor 134, an error correction code (ECC) component 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATH), small computer system interface (SCSI), enhanced small disk interface (ESDI) and integrated drive electronics (IDE). In accordance with an embodiment, the host interface 132 is a component for exchanging data with the host 102, which may be implemented through a firmware called a host interface layer (HIL).

The ECC component 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data into which a parity bit is added and to store the encoded data in memory device 150. The ECC decoder may detect and correct errors contained in a data read from the memory device 150 when the controller 130 reads the data stored in the memory device 150. That is, after performing error correction decoding on the data read from the memory device 150, the ECC component 138 may determine whether the error correction decoding has succeeded and output an instruction signal (e.g., a correction success signal or a correction fail signal). The ECC component 138 may use the parity bit which is generated during the ECC encoding process, for correcting the error bit of the read data. When the number of error bits is greater than or equal to a threshold number of correctable error bits, the ECC component 138 may not correct error bits but instead may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC component 138 may include all circuits, modules, systems or devices for performing the error correction operation based on at least one of the above described codes.

The PMU 140 may manage an electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of NAND flash interface, in particular, operations between the controller 130 and the memory device 150. In accordance with an embodiment, the memory interface 142 may be implemented through firmware called a Flash Interface Layer (FIL) as a component for exchanging data with the memory device 150.

The memory 144 may support operations performed by the memory system 110 and the controller 130. The memory 144 may store temporary or transactional data occurred or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the second memory 144 disposed within the controller 130, the invention is not limited thereto. That is, the memory 144 may be located within or external to the controller 130. For instance, the memory 144 may be embodied by an external volatile memory having a memory interface transferring data and/or signals between the memory 144 and the controller 130.

The memory 144 may store data necessary for performing operations such as data writing and data reading requested by the host 102 and/or data transfer between the memory device 150 and the controller 130 for background operations such as garbage collection and wear levelling as described above. In accordance with an embodiment, for supporting operations in the memory system 110, the memory 144 may include a program memory, a data memory, a write buffer/cache, a read buffer/cache, a data buffer/cache, a map buffer/cache, and the like.

The processor 134 may be implemented with a microprocessor or a central processing unit (CPU). The memory system 110 may include one or more processors 134. The processor 134 may control the overall operations of the memory system 110. By way of example but not limitation, the processor 134 may control a program operation or a read operation of the memory device 150, in response to a write request or a read request entered from the host 102. In accordance with an embodiment, the processor 134 may use or execute firmware to control the overall operations of the memory system 110. Herein, the firmware may be referred to as a flash translation layer (FTL). The FTL may perform an operation as an interface between the host 102 and the memory device 150. The host 102 may transmit requests for write and read operations to the memory device 150 through the FTL.

The FTL may manage operations of address mapping, garbage collection, wear-leveling and the like. Particularly, the FTL may load, generate, update, or store map data. Therefore, the controller 130 may map a logical address, which is entered from the host 102, with a physical address of the memory device 150 through the map data. The memory device 150 may look like a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

When performing an operation requested from the host 102 in the memory device 150, the controller 130 uses the processor 134. The processor 134 may handle instructions or commands corresponding to a command received from the host 102. The controller 130 may perform a foreground operation as a command operation, corresponding to an command received from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation includes an operation of copying and storing data stored in a memory block among the memory blocks 152, 154, 156 in the memory device 150 to another memory block, e.g., a garbage collection (GC) operation. The background operation may include an operation of moving or swapping data stored in at least one of the memory blocks 152, 154, 156 into at least another of the memory blocks 152, 154, 156, e.g., a wear leveling (WL) operation. During a background operation, the controller 130 may use the processor 134 for storing the map data stored in the controller 130 to at least one of the memory blocks 152, 154, 156 in the memory device 150, e.g., a map flush operation. A bad block management operation of checking or searching for bad blocks among the memory blocks 152, 154, 156 is another example of a background operation performed by the processor 134.

In accordance with an embodiment, the error check circuitry 38 of FIG. 1 may be implemented through at least one processor 134 of the controller 130 in FIG. 2. For example, when the error check circuitry 38 includes firmware, the firmware may be performed by at least one processor 134 after loading in at least one memory 144 of the controller 130 in FIG. 2.

In the memory system 110, the controller 130 performs a plurality of command operations corresponding to a plurality of commands entered from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) among a plurality of channels (or ways) for connecting the controller 130 to a plurality of memory dies included in the memory 150 is/are proper or appropriate for performing each operation. The controller 130 may transmit data or instructions via determined channels or ways for performing each operation. The plurality of memory dies included in the memory 150 may transmit an operation result via the same channels or ways, respectively, after each operation is complete. Then, the controller 130 may transmit a response or an acknowledge signal to the host 102. In an embodiment, the controller 130 may check a status of each channel or each way. In response to a command entered from the host 102, the controller 130 may select at least one channel or way based on the status of each channel or each way so that instructions and/or operation results with data may be delivered via selected channel(s) or way(s).

By way of example but not limitation, the controller 130 may recognize statuses regarding a plurality of channels (or ways) associated with a plurality of memory dies included in the memory device 150. The controller 130 may determine the state of each channel or each way as one of a busy state, a ready state, an active state, an idle state, a normal state and/or an abnormal state. The controller 130 may determine which channel or way an instruction (and/or a data) is delivered through, based on a physical block address, e.g., which die(s) the instruction (and/or the data) is delivered into. The controller 130 may refer to descriptors delivered from the memory device 150. The descriptors may include parameters or information stored in a block or page, which can describe something about the memory device 150. The descriptors may be divided into plural pieces of data with a predetermined format or structure. For instance, the descriptors may include device descriptors, configuration descriptors, unit descriptors, and the like. The controller 130 may refer to, or use, the descriptors to determine which channel(s) or way(s) an instruction or a data is exchanged via.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation (or the program operation), due to characteristics of a NAND logic function. During the bad block management, the data of the program-failed memory block or the bad memory block may be programmed into a new memory block. The bad blocks may seriously aggravate the utilization efficiency of the memory device 150 having a three-dimensional (3D) stack structure and the reliability of the memory system 110. Thus, reliable bad block management may enhance or improve performance of the memory system 110.

Figure 3:
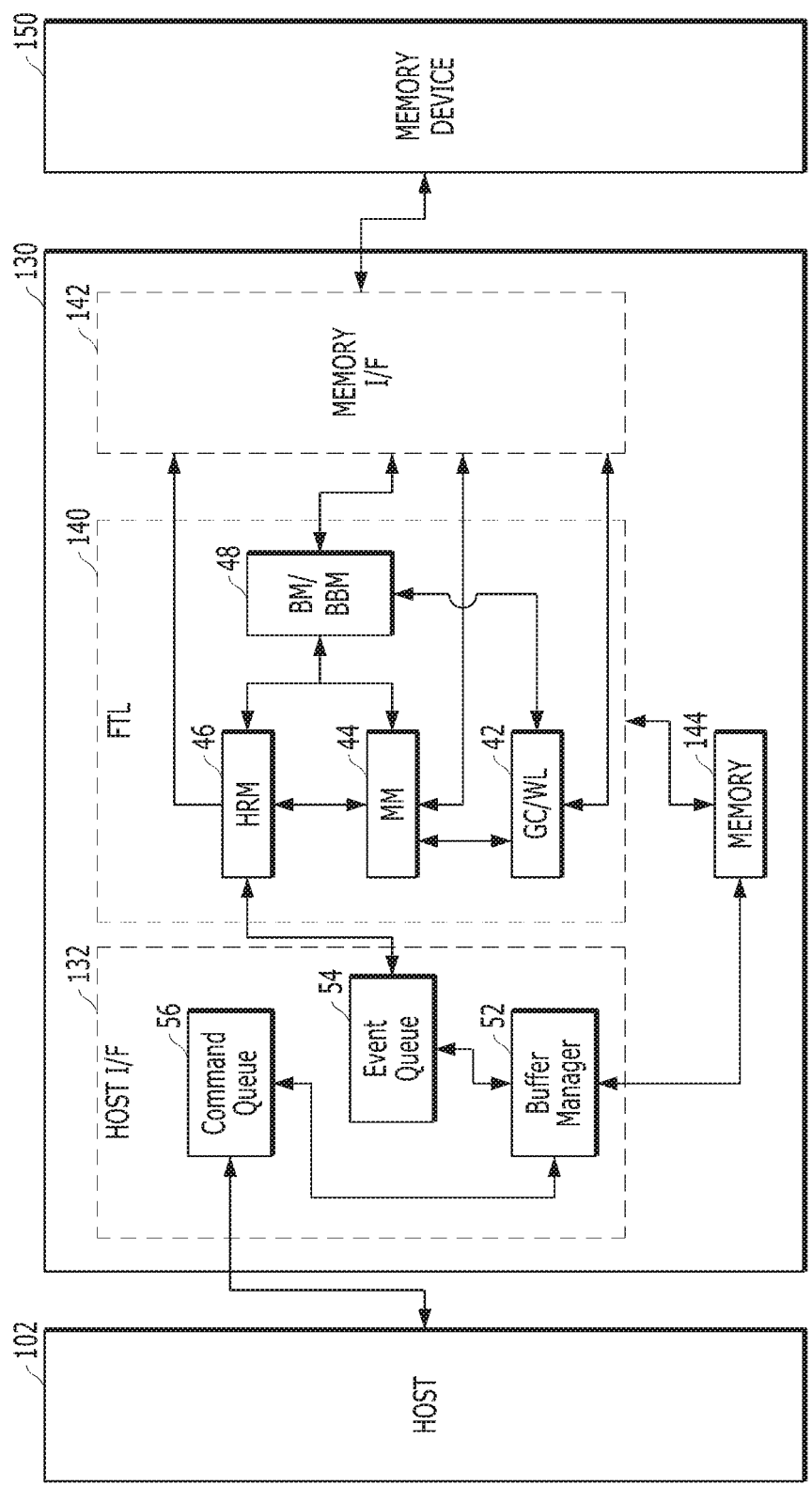
FIG. 3 illustrates a memory system in accordance with an embodiment of the disclosure.

FIG. 3 shows a controller 130 of a memory system in accordance with an embodiment of the disclosure.

Referring to FIG. 3, the controller 130 in a memory system in accordance with another embodiment of the disclosure is described in detail. The controller 130 cooperates with the host 102 and the memory device 150. The controller 130 includes a host interface (I/F) 132, a memory interface (I/F) 142, a memory 144 and a flash translation layer (FTL) 140.

Although not shown in FIG. 3, the ECC component 138 of FIG. 2 may be included in the FTL 140. In another embodiment, the ECC component 138 may be implemented as a separate module, a circuit, a firmware or the like, which is included in, or associated with, the controller 130.

The host interface 132 may handle commands, data, and the like received from the host 102. By way of example but not limitation, the host interface 132 may include a buffer manager 52, an event queue 54 and a command queue 56. The command queue 56 may sequentially store commands, data, and the like received from the host 102 and output them to the buffer manager 52 in a stored order. The buffer manager 52 may classify, manage or adjust the commands, the data, and the like, which are delivered from the command queue 56. The event queue 54 may sequentially transmit events for processing the commands, the data, and the like received from the buffer manager 52.

A plurality of commands and/or data of the same characteristic may be continuously received from the host 102. Alternatively, a plurality of commands and/or data of different characteristics may be received from the host 102, after being mixed or jumbled. For example, the host 102 may transmit a plurality of commands for reading data (i.e., read commands). For another example, the host 102 may alternatively transmit commands for reading data (i.e., read command) and programming/writing data (i.e., write command). The host interface 132 may store commands, data, and the like, which are received from the host 102, to the command queue 56 sequentially. Thereafter, the host interface 132 may estimate or predict what kind of operation the controller 130 will perform according to the characteristics of the command, data, and other relevant information which is received from the host 102. The host interface 132 may determine a processing order and a priority of commands and data, based at least on their characteristics. According to characteristics of commands and data, the buffer manager 52 of the host interface 132 is configured to determine whether the buffer manager 52 should store commands and data in the memory 144, or whether the buffer manager 52 should deliver the commands and the data to the FTL 140. The event queue 54 receives events, entered from the buffer manager 52, which are to be internally executed and processed by the memory system 110 or the controller 130 in response to the commands and the data, so as to deliver the events to the FTL 140 in the order received.

In accordance with an embodiment, the host interface 132 and the memory interface 142 of FIG. 3 may perform functions of the controller 130 described in FIG. 1 such as an operation performed by the interface 36.

In accordance with an embodiment, the FTL 140 may include a state manager (GC/WL) 42, a map manager (MM) 44, a host request manager (HRM) 46, and a block manager (BM or BBM) 48. The host request manager 46 may manage the events entered from the event queue 54. The map manager 44 may handle or control map data. The state manager 42 may perform garbage collection or wear leveling. The block manager 48 may execute commands or instructions on a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map manager 44, to determine a physical address corresponding to the logical address which is entered with the events. The host request manager 46 may send a read request with the physical address to the memory interface 142, to process the read request (or handle the events). On the other hand, the host request manager 46 may send a program request (or write request) to the block manager 48, to program entered data to a specific page of the unrecorded (no data) in the memory device 150. Then, the host request manager 46 may transmit a map update request corresponding to the program request to the map manager 44, to update an item relevant to the programmed data in information of mapping the logical-to-physical addresses to each other.

The block manager 48 may convert a program request delivered from the host request manager 46, the map manager 44, and/or the state manager 42 into a flash program request used for the memory device 150, to manage flash blocks in the memory device 150. In order to maximize or enhance program or write performance of the memory system 110 of FIG. 2, the block manager 48 may collect program requests and send flash program requests for multiple-plane and one-shot program operations to the memory interface 142. It can be plausible that the block manager 48 sends several flash program requests to the memory interface 142 to enhance or maximize parallel processing of the multi-channel and multi-directional flash controller (i.e., the memory interface 142).

The block manager 48 may be configured to manage blocks in the memory device 150 according to the number of valid pages. Further, the block manager 48 may select and erase blocks having no valid pages when a free block is needed, and select a block including the least valid page when it is determined that garbage collection is necessary. The state manager 42 may perform garbage collection to move the valid data to an empty block and erase the blocks containing the moved valid data so that the block manager 48 may have enough free blocks (i.e., empty blocks with no data). If the block manager 48 provides information regarding a block to be erased to the state manager 42, the state manager 42 could check all flash pages of the block to be erased to determine whether each page is valid. For example, to determine validity of each page, the state manager 42 may identify a logical address stored in an area (e.g., an out-of-band (OOB) area) of each page. To determine whether each page is valid, the state manager 42 may compare the physical address of the page with the physical address mapped to the logical address obtained from the inquiry request. The state manager 42 sends a program request to the block manager 48 for each valid page. A mapping table may be updated through the update of the map manager 44 when the program operation is completed.

The map manager 44 may manage a logical-to-physical mapping table. The map manager 44 may process requests such as queries, updates, and the like, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made, and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) is not completed normally, the map manager 44 may not perform the mapping table update. It is because the map request is issued with old physical information if the state manger 42 requests a map update and a valid page copy is completed later. The map manager 44 may perform a map update operation to ensure accuracy only if the latest map table still points to the old physical address.

In accordance with an embodiment, the state manager 42 may include the garbage collection control circuitry 196 shown in FIG. 1.

The memory device 150 may include a plurality of memory blocks. The plurality of memory blocks may be classified into different types of memory blocks such as a single level cell (SLC) memory block, a multi-level cell (MLC) memory block or the like, according to the number of bits that can be stored or represented in one memory cell of the block. The SLC memory block includes a plurality of pages implemented by memory cells, each storing one bit of data. The SLC memory block may have high data input and output (I/O) operation performance and high durability. The MLC memory block includes a plurality of pages implemented by memory cells, each storing multi-bit data (e.g., two bits or more). The MLC memory block may have larger storage capacity in the same space than the SLC memory block. The MLC memory block may be highly integrated in terms of storage capacity. In an embodiment, the memory device 150 may be implemented with MLC memory blocks such as an MLC memory block, a triple level cell (TLC) memory block, a quadruple level cell (QLC) memory block and a combination thereof. The MLC memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment of the disclosure, the memory device 150 is embodied as a nonvolatile memory such as a flash memory such as a NAND flash memory or a NOR flash memory. But, in another embodiment, the memory device 150 may be implemented by at least one of a phase change random access memory (PCRAM), a ferroelectrics random access memory (FRAM), a spin injection magnetic memory (STT-RAM), and a spin transfer torque magnetic random access memory (STT-MRAM), or the like.

Figure 4:
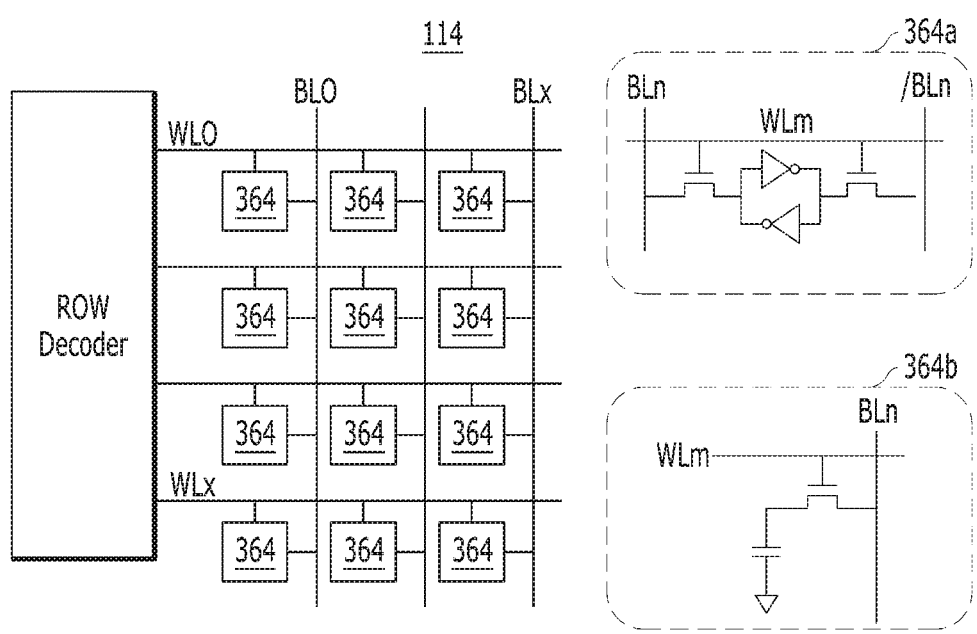
FIG. 4 shows a memory of a controller shown in FIGS. 1 to 3.

FIG. 4 shows a memory of a controller 130 in FIGS. 1 to 3. According to an embodiment, the memory may be included in the controller 130. Alternatively, the memory may be electrically connected to the controller 130.

Referring to FIG. 4, the memory 114 may include a plurality of memory cells 364. The plurality of memory cells 364 are individually addressable through a plurality of row addresses corresponding to the plurality of word lines WL0 to WLx and a plurality of column addresses corresponding to the plurality of bit lines BL0 to BLx. Thus, plural pieces of data stored in the plurality of memory cells 364 may be accessed through the plurality of word lines WL0 to WLx and the plurality of bit lines BL0 to BLx. The plurality of memory cells 364 may be conceptually illustrated in a form of a matrix as shown in FIG. 4. However, the form of the matrix of FIG. 4 is conceptual, and the plurality of memory cells 364 including highly integrated elements (e.g., transistors) in the memory 114 may have a planar or a cubic structure, and the structure thereof may be variously modified according to an embodiment.

The plurality of word lines WL0 to WLx may be selectively enabled by a row decoder. The row decoder may supply a voltage to a specific word line that corresponds to an address of data requested during an operation of the controller 130.

According to an embodiment, the memory 114 may be configured with the plurality of memory cells 364 which may have different structures. By way of example but not limitation, the memory cell 364 may include a static random access memory (SRAM) memory cell 364*a* comprised of a plurality of transistors and an inverter latch. Specifically, the SRAM cell 364*a* may include a plurality of transistors, as a switch, which are turned on or off via a single word line WLm between a pair of bit lines BLn, /BLn, and an inverter latch that forms a closed loop storing a piece of data between the plurality of transistors.

As another example, the memory cell 364 may include a dynamic random access memory (DRAM) memory cell 364*b* that includes one transistor and one capacitor. Specifically, the DRAM memory cell 364*b* may include a transistor serving as a switching transistor that is turned on/off through a single word line WLm and a capacitor capable of storing an amount of charge corresponding to a piece of data. When the transistor is turned on by a voltage applied to the word line WLm, the charge stored in the capacitor may flow into a bit line BLn.

Figure 5:
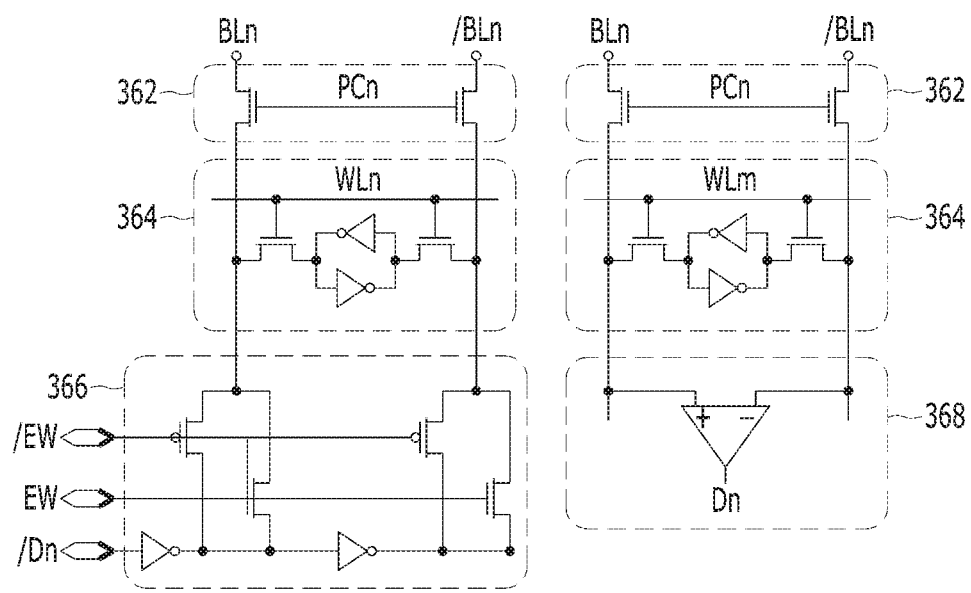
FIG. 5 shows a static random access memory (SRAM) as a memory in accordance with an embodiment of the disclosure.

FIG. 5 shows a static random access memory (SRAM) as a memory in accordance with an embodiment of the disclosure. The static RAM in FIG. 5 may be a part of the memory 114 in FIGS. 1 to 4.

Referring to FIG. 5, a memory cell 364 may be connected to a precharge unit 362, and a write driver 366 and/or a read driver 368 via a pair of bit lines BLn, /BLn. Although a single memory cell 364 is shown in FIG. 5, a plurality of memory cells may be connected to the pair of bit lines BLn, /BLn.

The precharge unit 362 may include a plurality of transistors as a switching element, which are turned on or off by a precharge signal PCn. The plurality of transistors may be coupled to respective bit lines BLn, /BLn.

According to an embodiment, the write driver 366 may include a plurality of transistors as a switching element, which are turned on or off by write enable signals EW, /EW and at least one inverter to deliver a piece of data. FIG. 5 illustrates an example in which an inverted value (/Dn) of data to be inputted by the user is delivered into the write driver 366. The write driver 366 may be designed to transfer an original value or an opposite value of data depending on the number of inverters in the write driver 366.

Data stored in the memory cell 364 may be transferred to the pair of bit lines BLn, /BLn through a plurality of transistors as a switching element, which is turned on by enabling the word line WLm. Two opposite values of the data stored in the memory cell 364 are transferred to the bit lines BLn, /BLn, respectively. In other words, data of the memory cell 364 are delivered into the read driver 368 via the bit lines BLn, /BLn. The read driver 368 may recognize a difference between the two opposite values delivered through the bit lines BLn, /BLn so as to output the data Dn based on the difference.

Figure 6:
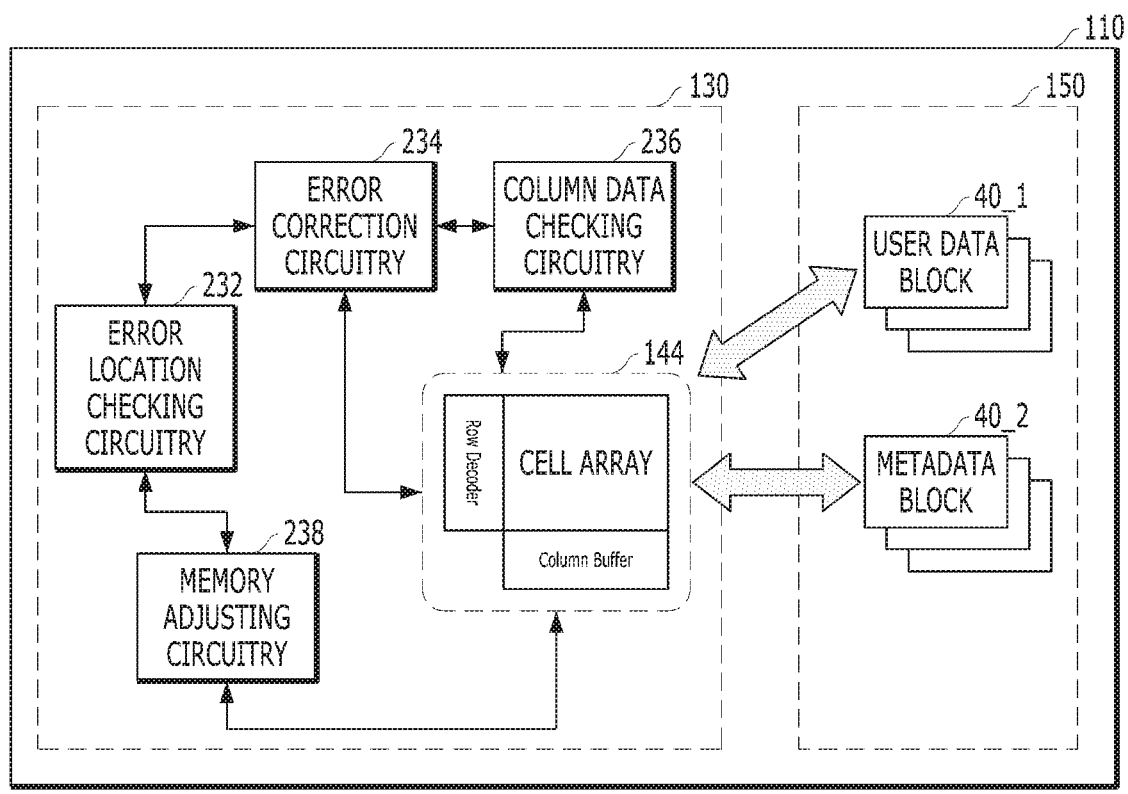
FIG. 6 illustrates a memory system in accordance with another embodiment of the disclosure.

FIG. 6 illustrates a memory system in accordance with another embodiment of the disclosure.

Referring to FIG. 6, the memory system 110 may include a controller 130 and a memory device 150. According to an embodiment, the memory device 150 may include a user data block 40_1 for storing user data and a metadata block 40_2 for storing metadata. Some of the user data or the metadata stored in the memory device 150 may be loaded into the memory 144 of the controller 130, and re-stored in the memory device 150 by the controller 130. In FIG. 6, an apparatus for detecting an error occurring in the memory 144 of the controller 130 and handling, curing or recovering the error will be mainly described.

The memory 144 may include a cell array, a row decoder, and a column buffer. The cell array includes a plurality of memory cells. The row decoder may serve to supply a voltage to a word line to select a part of the plurality of memory cells. The column buffer may serve to temporarily store data transferred through bit lines, from memory cells, which are selected via the word line.

In order to determine whether there is an error in a piece of data stored in the memory 144, the column data checking circuitry 236 may perform an exclusive-OR (XOR) operation on plural pieces of data, which are outputted from each column in the cell array. By way of example but not limitation, plural word lines corresponding to all or a part of the memory 144 may be sequentially enabled in order to check or verify plural pieces of data stored in all or a part of the memory 144. As the plural word lines are sequentially enabled, a plurality of memory cells connected to the enabled word lines may output a piece of data to the column buffer via each bit line sequentially. After plural pieces of data, which are delivered through the bit line, are sequentially transmitted to the column data checking circuitry 236, the column data checking circuitry 236 may perform the XOR operation on the plural pieces of data to determine whether the plural pieces of data have different values or the same value. For example, the XOR operation may generate a result of 0 or low level when the plural pieces of data have the same value. Otherwise, the XOR operation may generate a result of 1 or high level.

The error correction circuitry 234 may determine whether there is an error in plural pieces of data outputted from the column buffer, based on a result of determining whether the plural pieces of data have the same value, which is performed by the column data checking circuitry 236. In accordance with an embodiment, based on a type of data, the error correction circuitry 234 may divide a target area of the memory 144 into a subject region including memory cells coupled via some bit lines and a non-subject region including other memory cells coupled via other bit lines. The controller 130 may check an error in all or a part of the memory 144. For example, the target area may be a region in which the controller 130 checks an error. For example, the target area may be determined by how many word lines are enabled sequentially for checking an error. The subject region may include memory cells each storing a piece of meaningful data, while the non-subject region may include memory cells each storing a piece of perfunctory data.

For example, the cell array of the memory 144 may include a plurality of unit cells connected with 64-bit lines or 64 pairs of bit lines. When a single word line is enabled, plural memory cells (i.e., 64 memory cells) connected with 64-bit lines or 64 pairs of bit lines can output plural pieces of data, which can be understood as 64-bit data. When data stored in the plural memory cells of the cell array, which correspond to an enabled word line, is 64-bit user data, all bit lines (i.e., 64-bit) may be included in the subject region. However, in a case of data using only 8 bits, 16 bits, or 32 bits among 64 bits, only some bits are used instead of all 64 bits, and the other remaining bits are not used. A different value of '0' or '1' may be stored in each memory cell corresponding to a bit which is used. In contrast, the same value of '0' or '1' may be stored in all memory cells corresponding to a bit which is not used. Therefore, when an XOR operation is performed on plural pieces of data outputted from plural memory cells connected to each other via each bit line (i.e., a column unit) in the subject region, a result of the XOR operation may be '0' or '1'. However, when the XOR operation is performed on plural pieces of data outputted from plural memory cells connected to each other via each bit line in the non-subject region, a result of the XOR operation should be '0' when there is no error.

The error correction circuitry 234 may determine that there is no error in the non-subject region when the column data checking circuitry 236 outputs '0', i.e., that plural pieces of data outputted from plural memory cells corresponding to the same column address (i.e., a single bit line) are same with each other. However, if the column data checking circuitry 236 determines that plural pieces of data outputted from the memory cells corresponding to the single bit line are not all the same (that is, if any one of them is different) in the non-subject region, the error correction circuitry 234 may determine that there is an error in at least one of the memory cells corresponding to the bit line.

In a case when an error is detected in the non-subject region, the error correction circuitry 234 may correct the error by changing an error value with the same value stored in other memory cells of the non-subject region. For example, when a value of '0' is stored in memory cells of the non-subject region, the value of '0' may be inputted to a specific memory cell in which an error is detected. Conversely, when a value of '1' is stored in other memory cells of the non-subject region, the value of '1' may be inputted in a specific memory cell in which an error is detected. When it is determined that an error occurs due to not a permanent defect but a temporary cause in a memory cell, the write driver 366 of FIG. 5 may input a piece of data via a corresponding bit line into the memory cell in which the error occurs. When the error may be recovered by overwriting, operational stability and reliability of the memory system 110 may be improved or enhanced.

In a case of the subject region of the memory 144, the error correction circuitry 234 may not find an error by performing an exclusive OR (XOR) operation against plural pieces of data on a column basis. The error correction circuitry 234 may utilize a parity of the data or an algorithm using an ECC code to determine whether there is an error in the subject region.

When an error is detected in the subject region, the error correction circuitry 234 may determine how to recover the error in response to a state of data. In a case of the non-subject region, a method for newly overwriting a piece of data may be efficient. In a case of the subject region, the error correction circuitry 234 may not newly overwrite the piece of data to cure the error.

The memory 144 may store data or information loaded from the memory device 150 such as a volatile memory. Accordingly, the error correction circuitry 234 may determine that each data is in either a first state which is the same as a value when each data is loaded in the volatile memory or a second state which is updated after each data is loaded in the volatile memory device. Hereinafter, the first state may be referred as to a clean state, and the second state may be referred as to a dirty state.

When an error is detected in data stored in the memory 144 and the data is in the first state, the error correction circuitry 234 may reload that data from the memory device 150 to cure or recover the error. That is, when a piece of data has been not updated, changed, or modified by an operation performed by the controller 130 after the piece of data stored in the memory 144 was loaded from the memory device 150, the error correction circuitry 234 may select an operation for reloading that data from the memory device 150 to cure the error because the pieces of data stored in the memory 144 and the memory device 150 should be the same as each other.

When an error is detected in data stored in the memory 144 and the data stored in the memory 144 is in the second state, the error correction circuitry 234 may attempt an automatic error recovery on that data including the error. If the data has already been updated, changed, or modified through any operation performed by the controller 130, updated portions, data or contents may be lost or disappeared when that data is reloaded from the memory device 150. When the updated portions, data or contents are lost or disappeared, operational reliability of the memory system 100 may be deteriorated. In an embodiment, the automatic error recovery may use an algorithm that uses a parity of data or an ECC code.

In an embodiment, the controller 130 may further include an error location checking circuitry 232 that tracks a location of a memory cell corresponding to an error when the error correction circuitry 234 determines that there is an error. The error location checking circuitry 232 may adjust a range or a scope of data outputted from the memory cells corresponding to each column address, which are transmitted to the column data checking circuitry 236, in order to track the location of the memory cell corresponding to the error.

For example, an exclusive OR (XOR) operation is performed in a column unit (i.e., per bit line) of the entire cell array in the memory 144, and then an error is detected in a specific column. In this case, the error correction circuitry 234 may not detect which one of the memory cells outputting plural pieces of data via a bit line is erroneous. When an error is detected in a specific column, the error location checking circuitry 232 may enable a half number of word lines sequentially to limit a scope or a range of the entire cell array (e.g., a half) in the memory 144. When no error is detected, it may be determined that there is an error in the other half of the entire cell array in the memory 144. To track a location of the error occurring in a specific column, the error location checking circuitry 232 may gradually reduce a scope or a range for checking the error and recognize a specific location of the memory cell corresponding to the error.

The error location checking circuitry 232 may store the location of the memory cell corresponding to the error in either the memory 144 or the memory device 150. Storing the location of the memory cell corresponding to the error may be performed to determine whether an error is permanent or temporary. When errors occur repeatedly at a specific location in the memory 144, i.e., if errors have been detected in the same location, the corresponding memory cell of the memory 144 is suspected of permanent defect.

The error location checking circuitry 232 may store a location of a memory cell corresponding to an error whenever the error is detected and monitor whether an error has occurred repeatedly at the same location to determine whether the memory cell has a permanent defect or a temporary defect. When the error location checking circuitry 232 determines that a specific memory cell has a permanent defect, a memory adjusting circuitry 238 may replace the specific memory cell with a redundant memory cell in a redundancy area in response to whether the specific memory cell has the permanent defect. The memory 144 may include the redundancy area that is a kind of extra area not used for a normal operation. The redundancy area may include plural units of rows or columns. When it is determined that a specific memory cell is permanently defective, a row or a column including the memory cell may be replaced with a row or a column of the redundancy area.

Figure 7A:
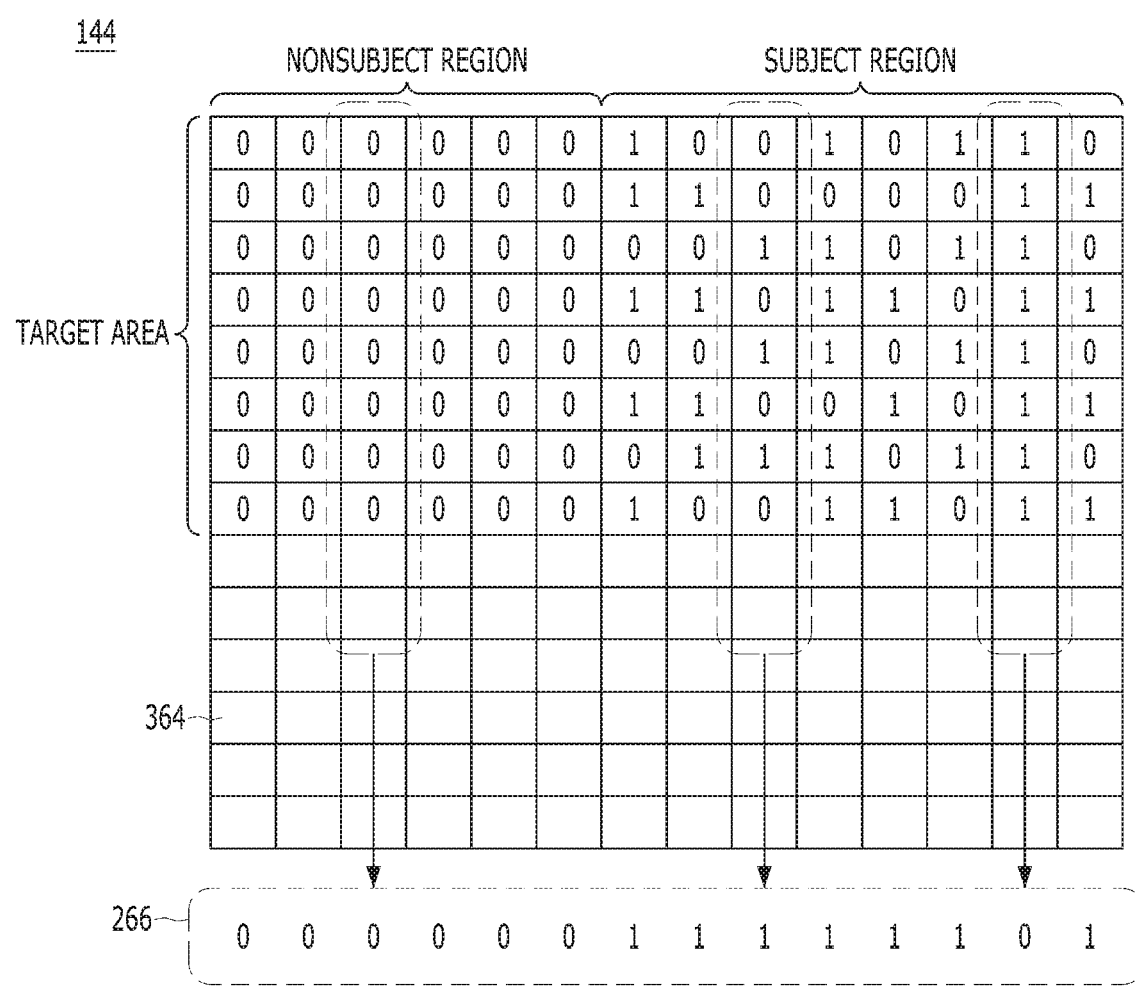
FIGS. 7A and 7B shows operations of a column data checking circuitry and an error correction circuitry in accordance with an embodiment of the disclosure.
Figure 7B:
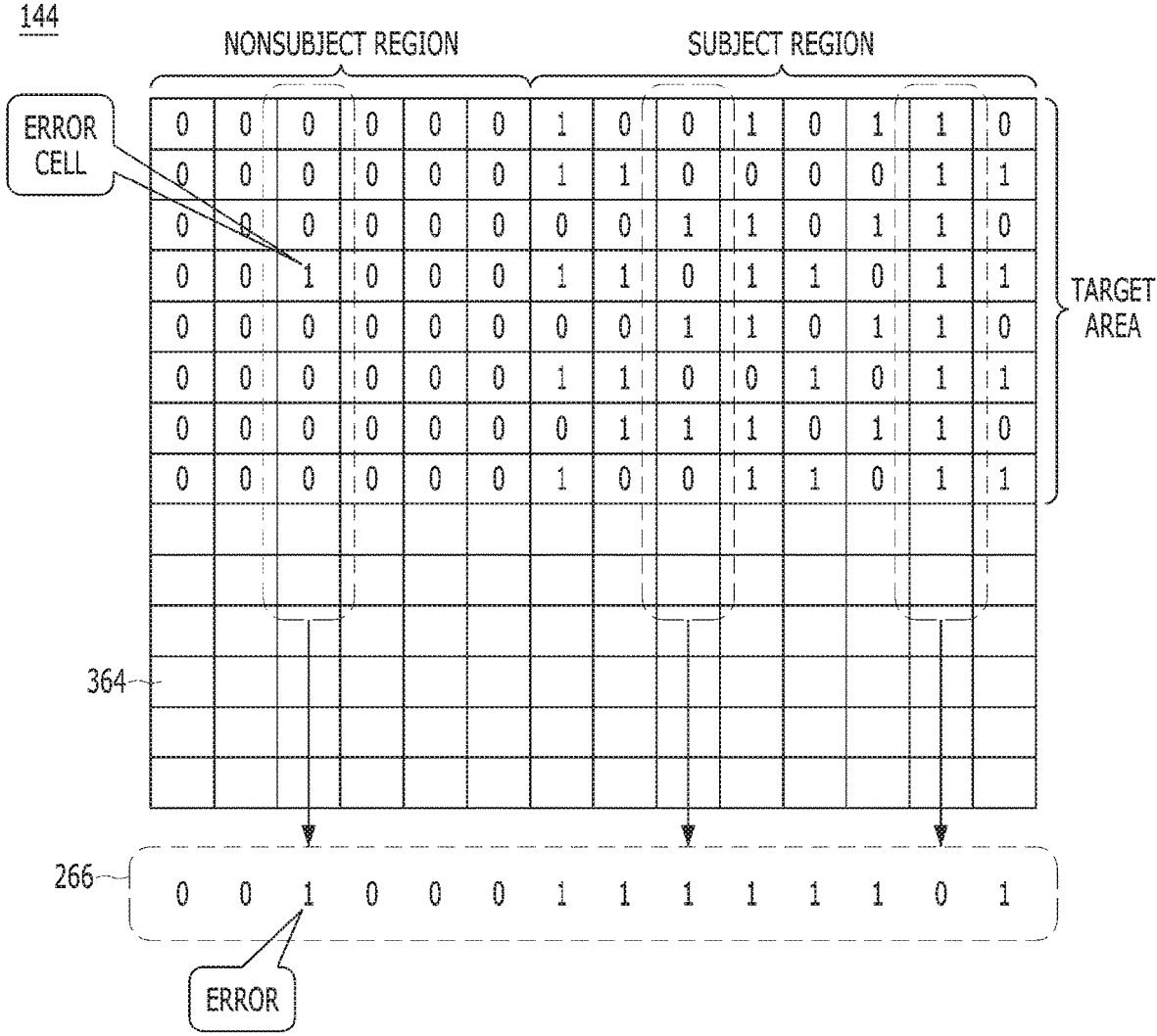

FIGS. 7A and 7B show operations of a column data checking circuitry and an error correction circuitry in accordance with an embodiment of the disclosure. Specifically, FIG. 7A illustrates a case where there is no error in plural pieces of data stored in the memory 144, and FIG. 7B illustrates a case where there is an error in plural pieces of data stored in the memory 144. The error in FIG. 7A or 7B may be determined based on data outputted from the memory cell 364.

Referring to FIG. 7A, plural pieces of data loaded into the memory 144 is a kind of data having a size of some bits, but not all of the bits of the memory 144. Accordingly, the memory 144 may be divided into a subject region and a non-subject region.

It is possible to check whether there is an error in data based on a result 266 of performing an exclusive-OR (XOR) operation on plural pieces of data outputted via each bit line or each column unit in the target area of the memory 144. All memory cells in the non-subject region should be stored with a value of '0'. When the value of '0' are stored in all memory cells of the non-subject region, the result 266 of performing the XOR operation, corresponding to the non-subject region, becomes '0'. In this case, it may be determined that there is no error in the non-subject region within the target area of the memory 144.

In a case of the subject region in the memory 144, it is very likely that a result of '1' is obtained when an XOR operation is performed on plural pieces of data outputted via each bit line or each column unit. Further, a result of '0' may be obtained from plural pieces of data outputted in a specific bit line or column unit. In contrast, in the case of the subject region in the memory 144, it may be impossible to exclude the possibility that a result of '0' other than '1' is derived, so that the result may not be considered that there is an error in any one of the memory cells coupled via the corresponding bit line or column unit.

Referring to FIG. 7B, when there is an error in the non-subject region of the memory 144, results 266 of performing an exclusive-OR (XOR) operation on each bit line or each column unit in the target area of the memory 144 shows which bit line a memory cell corresponding to the error is coupled with. The result 266 for the non-subject region of the memory 144 should be '0'. But, if the result of '1' is obtained, it may be determined that at least one of the memory cells 364 corresponding to the bit line or the column unit has an error.

Herein, a memory cell in which an error has occurred cannot be specified only based on the result 266 of performing the XOR operation on the plural pieces of data outputted via each bit line or each column unit in the target area of the memory 144. However, as described in FIG. 6, when changing a scope or a range of the target area and obtaining the result 266 of performing the XOR operation, the controller 130 may specify which memory cell corresponds to the error.

According to an embodiment, the column data checking circuitry 236 of FIG. 6, which generates the result 266 of performing an XOR operation on each bit line or each column unit in the target area of the memory 144, may be implemented by software, logic, or logic circuitry. When not disturbing performance of the memory system 110 of FIG. 6, the column data checking circuitry 236 may be designed in various ways.

Figure 8:
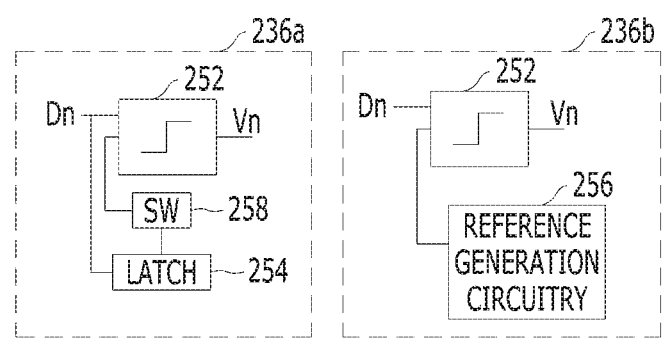
FIG. 8 illustrates an operation of a column data checking circuitry in accordance with an embodiment of the disclosure.

FIG. 8 illustrates an operation of a column data checking circuitry in accordance with an embodiment of the disclosure. For example, FIG. 8 illustrates that the column data checking circuitry 236 of FIG. 6 may be implemented with two different embodiments of the column data checking circuitry 236a, 236b.

Referring to FIG. 8, the column data checking circuitry 236 may be implemented as a logic or a circuit that may perform an exclusive OR (XOR) on plural pieces of data transferred sequentially. For example, the column data checking circuitry 236a, 236b may be coupled to a bit line in parallel with a buffer or a data amplifier. Each of the column data checking circuitry 236 may include a comparator 252 configured to compare two pieces of data Dn sequentially received via the bit line. In FIG. 5, pieces of data stored in the unit cells 364 may be sequentially transmitted to the column data checking circuitry 236a, 236b through the read driver 368.

According to an embodiment, the column data checking circuitry 236b may further include a reference generation circuitry 256 configured to generate a value of '0' or '1'. For example, the reference generation circuitry 256 may be required to determine whether a first piece of data received through the read driver 368 includes an error. When the non-subject region in the memory 144 of FIG. 7 is set to '0', the reference generation circuitry 256 may output a value of '0'. The comparator 252 may compare the first piece of data from the non-subject region of the memory 144 with the value of '0' outputted from the reference generation circuitry 256. Based on a comparison result Vn of the comparator 252, it may be determined whether a first piece of data received via each bit line from the non-subject region of the memory 144 is erroneous.

The second or later piece of data received through the read driver 368 may be compared with a value outputted from the reference generation circuitry 256 to determine whether the second or later piece of data is erroneous. If a piece of data received through the read driver 368 may be compared by the comparator 252 with the output of the reference generation circuitry 256 immediately and it could be known which word line is enabled to output the piece of data compared by the comparator 252, the controller 130 or the error location checking circuitry 232 may recognize which memory cell outputs erroneous data when a result Vn of the comparator 252 is changed. When the result Vn of the comparator 252 is not changed, it could be presumed that there is no error in plural pieces of data, which are received via a bit line from the non-subject region of the memory 144. This process may be performed by the error location checking circuitry 232 described with reference to FIG. 6, according to an embodiment.

According to an embodiment, the column data checking circuitry 236a may further include a latch 254 for storing data received via the bit line and a switch (SW) 258 for connecting the latch 254 to the comparator 252. Although not shown in FIG. 8, another switch may be arranged between the latch 254 and the read driver 368 of FIG. 5 or the bit line. A piece of data Dn transferred to the column data checking circuitry 236a is stored in the latch 254. The comparator 252 may determine whether a piece of data Dn currently delivered is the same as the piece of data stored in the latch 254. That is, the comparator 252 may compare the previous piece of data with the current piece of data to output the result Vn indicating whether they are the same.

FIG. 9 illustrates an operation of an error correction circuitry in accordance with an embodiment of the disclosure, for example, the error correction circuitry 234 of FIG. 6.

Referring to FIG. 9, the error correction circuitry 234 may determine whether there is an error in plural pieces of data stored in the memory in accordance with a type of data stored in the memory, a state of the data, and a column data decision which is an output of the column data checking circuitry 236 of FIG. 6. Further, the error correction circuitry 234 may be configured to determine how to cure the error based at least on the state of the data including the error.

Referring to FIGS. 1 to 3 and 6, metadata and user data may be stored in the memory 144 of the controller 130. Although not shown, the memory 144 may temporarily store various information that may be generated or loaded during an operation of the controller 130. The reason for comparing the metadata with user data as an example is that only a part of the memory 144 (i.e., memory cells coupled to some bit lines) may be used for the metadata, but all of the memory 144 (i.e., memory cells coupled to all bit lines) may be used for the user data, because a size or a length of metadata may be smaller or shorter than that of user data. Except for the metadata and the user data, various information items that may be stored in the memory 144 may be divided into a case of using memory cells coupled to all bit lines of the memory 144 and another case of using memory cells coupled to some bit lines of the memory 144.

According to an embodiment, when all bit lines of the memory 144 are not used, that is, the metadata is stored in the memory 144, the error correction circuitry 234 may perform an XOR operation on plural pieces of data stored in the memory 144 on a bit line basis or column unit basis. However, when all bit lines of the memory 144 are used, that is, user data is stored in the memory 144, the error correction circuitry 234 may not care about errors.

By way of example but not limitation, according to a result of the column data checking circuitry 236, the error correction circuitry 234 may recognize an error in the non-subject region of the memory 144 but may not recognize the error in the subject region.

According to a state of data stored in the memory 144, the error correction circuitry 234 may determine how to recover an error after recognizing that there is the error in the data. For example, if a piece of data stored in the memory 144 is in a dirty state, the error correction circuitry 234 may perform automatic error recovery. For example, the automatic error recovery may be performed through an algorithm using a parity of data or an ECC code. On the other hand, when the piece of data stored in the memory 144 is in a clean state, the error correction circuitry 234 may reload the original data from the memory device 150 rather than perform an error recovery using an error correction algorithm that may be complicated.

As shown in FIG. 9, the error correction circuitry 234 may handle, cure or recover an error that may temporarily occur in the memory 144. However, when it is presumed that an error occurring at a specific location of the memory 144 is not temporary but permanent, it is necessary to replace a defective memory cell with a heathy memory cell located in a redundancy area through the memory adjusting circuitry 238 of FIG. 6.

Figure 10:
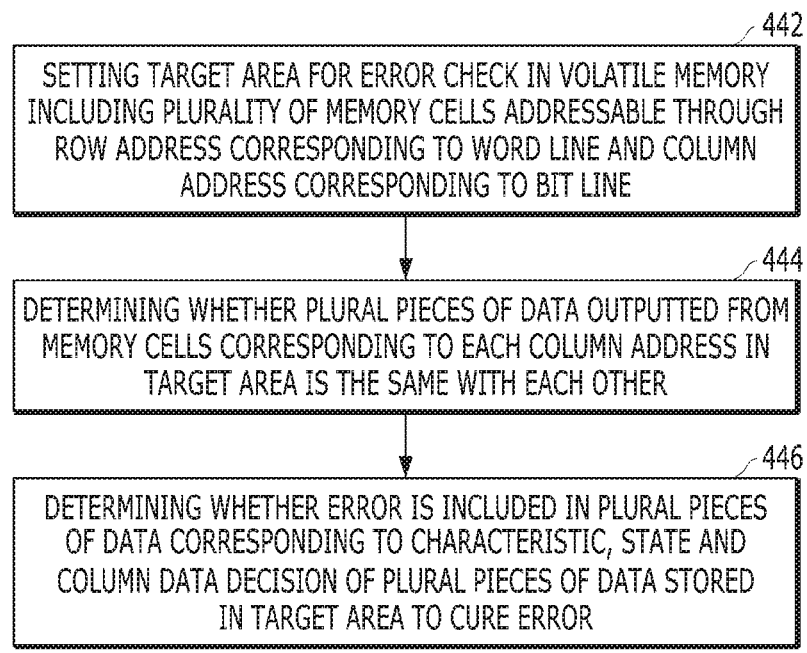
FIG. 10 illustrates an operation method for a memory system in accordance with an embodiment of the disclosure.

FIG. 10 illustrates an operation method for a memory system in accordance with an embodiment of the disclosure.

Referring to FIG. 10, an operation method for a memory system includes a step 442, a step 444 and a step 446. The step 442 may include a step of setting a target area for error check in a volatile memory including a plurality of memory cells addressable through a row address corresponding to a word line and a column address corresponding to a bit line. The step 444 may include a step of determining whether plural pieces of data outputted from memory cells corresponding to each column address in a target area are the same as each other. The step 446 may include a step of determining whether an error is included in the plural pieces of data based on a type of data, a state of data, and a column data comparison result between the plural pieces of data stored in the target area to cure the error.

Although not shown in FIG. 10, in order to check whether there is an error in the memory, the operation method for the memory system further includes a step of dividing the volatile memory into a subject region including memory cells coupled via some bit lines and a non-subject region including other memory cells coupled via other bit lines, based on the type of data. Further, the operation method includes a step of determining that there is an error in at least one of memory cells corresponding to the column address when all pieces of data outputted from the memory cells corresponding to the column address in the non-subject region are not identical to each other. When all pieces of data outputted from the memory cells corresponding to the column address in the non-subject region are identical to each other, it is presumed that there is no error in at least one of memory cells corresponding to the column address.

In various embodiments, the step 446 of determining whether an error is included in the plural pieces of data may include a step of determining that each data is in either a first state which is the same as a value when each data is loaded in the volatile memory or a second state which is updated after each data is loaded in the volatile memory device. Further, the step 446 may include a step of determining how to recover the error based on the state of data. For example, when the data including an error is in the first state, the data stored in the memory may be replaced with the original data re-loaded from the memory device to cure or recover the error. When the data including an error is in the second state, the memory system may attempt an automatic error recovery on the data including the error.

As described above, according to embodiments of the disclosure, the memory system may identify, repair and correct a temporary fault or error that may occur during its operation so that operational stability and reliability of the memory system may be enhanced or improved.

In accordance with embodiments described above, a memory system, a data processing system, and an operation method thereof may search for an error, which occurred in a volatile memory that supports an operation of a controller in a nonvolatile memory system and recover or cure the error in the volatile memory to increase or enhance operational reliability of the nonvolatile memory system.

Embodiments of the disclosure may provide an apparatus and a method for searching for, and handling or curing, an error occurring at a memory cell in a volatile memory, such as a cache memory having a small storage capacity but operating at high speed, so that productivity for an integrated circuit including the volatile memory may be improved as well as the competitiveness of the nonvolatile memory system may be enhanced or improved.

While the disclosure has been illustrated and described with respect to specific embodiments, it will be apparent to those skilled in the art in light of the present disclosure that various changes and modifications may be made without departing from the spirit and scope of the invention as defined in the following claims.

What is claimed is:

1. An apparatus for controlling an operation in a memory system, comprising:
    a volatile memory including plural memory cells;
    a column data checking circuitry configured to determine whether pieces of data stored in memory cells connected to a bit line are identical to each other; and
    an error correction circuitry configured to determine whether the pieces of data include an error based at least on a type of data, a state of data, and an output of the column data checking circuitry, and to resolve the error,
    wherein the column data checking circuitry comprises:
        a comparator coupled to a buffer or an amplifier which is coupled with the memory cells via the bit line, and configured to compare two pieces of data delivered sequentially from the memory cells;
        a latch for temporarily storing a piece of data delivered through the bit line; and
        a switch for selectively connecting the latch and the comparator.

2. The apparatus according to claim 1, wherein the volatile memory includes a static random access memory including at least one memory cell including plural transistors.

3. The apparatus according to claim 1, wherein the volatile memory includes a subject region including memory cells coupled via some bit lines and a non-subject region including other memory cells coupled via other bit lines, wherein the pieces of data are stored in either the subject region or the non-subject region based on the type of data.

4. The apparatus according to claim 3, wherein the error correction circuitry is configured to determine that there is an error in at least one of memory cells corresponding to a column address when all pieces of data stored in the memory cells corresponding to the column address in the non-subject region are not identical to each other.

5. The apparatus according to claim 3, wherein the error correction circuitry is configured to:
    change an erroneous value of data into another value which is the same as other pieces of data when it is determined that the error exists in the non-subject region; and
    determine how to recover the error, based on the state of data, when it is determined that the error exists in the subject region.

6. The apparatus according to claim 1, wherein the error correction circuitry is configured to:
    determine that a state of each piece of data is either a first state which is the same as a value when each piece of data is loaded in the volatile memory or a second state which is updated after each piece of data is loaded in the volatile memory; and
    determine how to recover the error based on the state of each piece of data.

7. The apparatus according to claim 6, wherein the error correction circuitry is configured to:
    reload a piece of data corresponding to the error from a nonvolatile memory device to resolve the error, when a state of the piece of data is the first state; and
    perform an error correction recovery on the piece of data including an error when the state of the piece of data is the second state.

8. The apparatus according to claim 7, further comprising:
    an error location checking circuitry configured to track a location of a memory cell corresponding to the error when the error correction circuitry determines that the error is included in all pieces of data.

9. The apparatus according to claim 8, wherein the error location checking circuitry is configured to adjust a range of data outputted to the column data checking circuitry to track the location of the memory cell corresponding to the error.

10. The apparatus according to claim 8, further comprising:
    a memory adjusting circuitry configured to store the location of the memory cell corresponding to the error, which is tracked by the error location checking circuitry, monitor whether another error has occurred repeatedly at the location to determine whether the corresponding memory cell is considered a bad memory cell, and replace the corresponding memory cell with a redundancy cell.

11. A memory system, comprising:
a nonvolatile memory device including plural memory blocks; and
a controller including a volatile memory configured to store metadata and user data during an operation for writing the user data in the nonvolatile memory device or reading the user data stored in the nonvolatile memory device,
wherein the controller is configured to determine whether the metadata and the user data include an error based at least on a type of data and a state of data, to determine that a state of the metadata and the user data is either a first state which is the same as a value when the metadata and the user data are loaded in the volatile memory or a second state which is updated after the metadata and the user data are loaded in the volatile memory, to determine how to recover the error based on the state of the metadata and the user data, and to resolve the error.

12. The memory system according to claim 11, wherein the volatile memory includes plural memory cells which are individually addressable through a row address corresponding to a word line and a column address corresponding to a bit line.

13. The memory system according to claim 12, wherein the controller includes:
a column data checking circuitry configured to determine whether all pieces of data outputted from memory cells corresponding to a single bit line are identical to each other; and
an error correction circuitry configured to determine whether the pieces of data include an error based at least on the type of data, the state of data, and an output of the column data checking circuitry, and to recover the error.

14. A method for operating a memory system, comprising:
setting a target area for error check in a volatile memory including a plurality of memory cells that are each addressable through a row address corresponding to a word line and a column address corresponding to a bit line;
determining whether plural pieces of data outputted from memory cells corresponding to each column address in the target area are the same as each other; and
determining whether an error is included in the plural pieces of data based on a type of data, a state of data, and a column data comparison result between the plural pieces of data stored in the target area to resolve the error,
wherein the determining of whether an error is included includes:
determining that a state of each piece of data is in either a first state which is the same as a value when each data is loaded in the volatile memory or a second state which is updated after each data is loaded in the volatile memory; and
determining how to recover the error based on the state of each piece of data.

15. The method according to claim 14, wherein the target area of the volatile memory includes a subject region including memory cells coupled via some bit lines and a non-subject region including other memory cells coupled via other bit lines, based on the type of data.

16. The method according to claim 15, further comprising:
determining that there is no error in at least one of memory cells corresponding to the column address when all pieces of data outputted from the memory cells corresponding to the column address in the non-subject region are identical to each other.

17. The method according to claim 14, wherein the determining of whether an error is included further includes:
reloading data corresponding to the error from a nonvolatile memory device to resolve the error, when a state of each piece of data is the first state; and
performing an error correction recovery on the data including an error when the state of each piece of data is the second state.

* * * * *